US010453744B2

United States Patent
Meng et al.

(10) Patent No.: US 10,453,744 B2
(45) Date of Patent: Oct. 22, 2019

(54) LOW TEMPERATURE MOLYBDENUM FILM DEPOSITION UTILIZING BORON NUCLEATION LAYERS

(71) Applicant: Entegris, Inc., Billerica, MA (US)

(72) Inventors: Shuang Meng, Danbury, CT (US); Richard Ulrich Assion, Danbury, CT (US); Thomas H. Baum, New Fairfield, CT (US); Bryan Clark Hendrix, Danbury, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 15/958,568

(22) Filed: Apr. 20, 2018

(65) Prior Publication Data

US 2018/0261503 A1   Sep. 13, 2018

Related U.S. Application Data

(63) Continuation-in-part of application No. 15/820,640, filed on Nov. 22, 2017, now abandoned.

(60) Provisional application No. 62/425,704, filed on Nov. 23, 2016.

(51) Int. Cl.
| | |
|---|---|
| *H01L 21/768* | (2006.01) |
| *C23C 16/40* | (2006.01) |
| *C23C 16/02* | (2006.01) |
| *H01L 21/285* | (2006.01) |
| *C23C 16/455* | (2006.01) |
| *H01L 21/3205* | (2006.01) |
| *C23C 16/14* | (2006.01) |
| *C23C 16/28* | (2006.01) |
| *H01L 21/28* | (2006.01) |

(52) U.S. Cl.
CPC .... *H01L 21/76876* (2013.01); *C23C 16/0272* (2013.01); *C23C 16/14* (2013.01); *C23C 16/28* (2013.01); *C23C 16/405* (2013.01); *C23C 16/45527* (2013.01); *H01L 21/28061* (2013.01); *H01L 21/28556* (2013.01); *H01L 21/28568* (2013.01); *H01L 21/32051* (2013.01); *H01L 21/76853* (2013.01); *H01L 2221/1089* (2013.01)

(58) Field of Classification Search
CPC combination set(s) only.
See application file for complete search history.

(56) References Cited

U.S. PATENT DOCUMENTS

| | | | |
|---|---|---|---|
| 5,175,017 A | 12/1992 | Kobayashi et al. | |
| 6,416,890 B1 * | 7/2002 | Terneu | C03C 17/3417 428/701 |
| 2004/0007171 A1 | 1/2004 | Ritala et al. | |
| 2004/0018723 A1 | 1/2004 | Byun et al. | |
| 2005/0118804 A1 | 6/2005 | Byun et al. | |
| 2005/0181598 A1 | 8/2005 | Kailasam | |
| 2006/0134322 A1 | 6/2006 | Harris et al. | |
| 2006/0210810 A1 | 9/2006 | Harris et al. | |
| 2008/0296660 A1 | 12/2008 | Park et al. | |
| 2009/0235983 A1 | 9/2009 | Girt et al. | |
| 2010/0303565 A1 | 12/2010 | Xiao et al. | |
| 2013/0075909 A1 | 3/2013 | Park et al. | |
| 2013/0230715 A1 | 9/2013 | Levashov et al. | |
| 2014/0117308 A1 | 5/2014 | Hyot et al. | |
| 2014/0154883 A1 * | 6/2014 | Humayun | H01L 21/67207 438/675 |
| 2014/0256156 A1 | 9/2014 | Harada et al. | |
| 2015/0064471 A1 | 3/2015 | Dresselhaus et al. | |
| 2015/0262828 A1 * | 9/2015 | Brand | H01L 21/823842 438/592 |
| 2015/0287594 A1 | 10/2015 | Hirose et al. | |
| 2015/0325447 A1 | 11/2015 | Ogawa et al. | |
| 2016/0040289 A1 | 2/2016 | Gatineau | |
| 2016/0308006 A1 | 10/2016 | Park et al. | |
| 2017/0175290 A1 * | 6/2017 | Chen | C30B 1/10 |
| 2017/0207087 A1 | 7/2017 | Roy et al. | |
| 2018/0019165 A1 | 1/2018 | Baum et al. | |
| 2018/0247821 A1 * | 8/2018 | Chen | H01L 21/0262 |

FOREIGN PATENT DOCUMENTS

| | | |
|---|---|---|
| GB | 1330720 A | 9/1973 |
| TW | 201011719 A | 3/2010 |
| TW | 201504247 A | 2/2015 |
| TW | 201518560 A | 5/2015 |
| TW | 201542570 A | 11/2015 |
| TW | 201616666 A | 5/2016 |

* cited by examiner

*Primary Examiner* — Mamadou L Diallo
(74) *Attorney, Agent, or Firm* — Entegris, Inc.

(57) ABSTRACT

The disclosure relates to a method of making molybdenum films utilizing boron and molybdenum nucleation layers. The resulting molybdenum films have low electrical resistivity, are substantially free of boron, and can be made at reduced temperatures compared to conventional chemical vapor deposition processes that do not use the boron or molybdenum nucleation layers. The molybdenum nucleation layer formed by this process can protect the substrate from the etching effect of $MoCl_5$ or $MoOCl_4$, facilitates nucleation of subsequent CVD Mo growth on top of the molybdenum nucleation layer, and enables Mo CVD deposition at lower temperatures. The nucleation layer can also be used to control the grain sizes of the subsequent CVD Mo growth, and therefore controls the electrical resistivity of the Mo film.

20 Claims, No Drawings

LOW TEMPERATURE MOLYBDENUM FILM DEPOSITION UTILIZING BORON NUCLEATION LAYERS

CROSS-REFERENCE TO RELATED APPLICATIONS

This application is a continuation-in-part of U.S. patent application Ser. No. 15/820,640, filed Nov. 22, 2017, which claims the benefit of U.S. Provisional Application No. 62/425,704, filed Nov. 23, 2016, the disclosure of which is hereby incorporated by reference herein in its entirety for all purposes.

FIELD

The present disclosure relates to vapor deposited molybdenum films or layers that can be made at lower process temperatures, but with deposition rates similar to those achieved using traditional high temperature vapor deposition conditions for molybdenum. The resulting molybdenum films or layers formed by the lower temperature deposition also have low resistivity and can be used in a variety of articles like semiconductor devices and display devices.

BACKGROUND

Molybdenum is a low-resistivity refractory metal that can potentially replace tungsten as a material in memory, logic chips, and other devices using polysilicon-metal gate electrode structures. A thin film containing molybdenum can also be used in some organic light emitting diodes, liquid crystal displays, and also in thin film solar cells and photovoltaics. A thin molybdenum film can be used as a barrier film.

Various precursors and vapor deposition techniques have been used to deposit thin molybdenum films. Precursors include inorganic and organometallic reagents and vapor deposition techniques can include chemical vapor deposition (CVD) and atomic layer deposition (ALD) as well as a number of modifications such as UV laser photo-dissociation CVD, plasma assisted CVD, and plasma assisted ALD. The CVD and ALD processes are being increasingly used because they can give excellent conformal step coverage on highly non-planar microelectronics device geometries, however the costs and complexity of plasma assisted deposition and high temperature deposition systems can increase production costs and tool costs. High temperature processes can also damage previously deposited or underlying structures.

In a typical CVD process, the precursors are passed over an optionally heated substrate (e.g., a wafer) in a low pressure or ambient pressure reaction chamber. The precursors react and/or decompose on the substrate surface creating a thin film of deposited material like molybdenum. Volatile by-products are removed by gas flow through the reaction chamber. Some metal films are formed in a CVD process by supplying two or more gases to a reaction chamber with reaction of the gases leading to the deposition of the metal on the substrate. The deposited film thickness and uniformity depends on coordination of many parameters such as temperature, pressure, gas flow rates and mixing uniformity, chemical depletion effects, and time.

Refractory metal films have been deposited on substrates in a CVD process comprising heating in an enclosed chamber a substrate like silicon dioxide to a temperature of about 500° C. to 800° C., treating the heated surface with a vaporized substance like molybdenum hexafluoride for a brief period of time to increase the adherence of the surface to a molybdenum layer to be subsequently deposited, purging all the unreacted molybdenum hexafluoride from the chamber, and then depositing a molybdenum film by mixing hydrogen with some newly vaporized molybdenum hexafluoride to thereby reduce the molybdenum hexafluoride, generate HF(g), and deposit some of the molybdenum on the heated surface. The high temperatures for this deposition makes the processing equipment complex and consumes thermal budget for temperature sensitive devices. Further, the toxicity of HF(g) and associated abatement and safety equipment for handling HF(g) makes this process expensive and complex.

Smooth, low resistivity molybdenum films with good step coverage can be deposited on substrates by chemical vapor deposited (CVD) at high temperatures of about 700° C. using $MoOCl_4$ or $MoCl_5$ as molybdenum precursor and $H_2$ as a reducing gas. These high temperature molybdenum films are useful, but lower deposition temperatures would be even more beneficial because it would consume less of the thermal budget of the materials used to make a device like a DRAM or photovoltaic, and because less expensive and complex equipment could be used to make the films. As the temperature of the substrate during the above deposition process was lowered below 700° C., a reaction temperature cutoff was observed that was about 550° C. for both $MoOCl_4$ and $MoCl_5$. Near this temperature, film roughness increased, film resistivity increased, and film deposition rate decreased and eventually ceased below the cutoff temperature. This cutoff temperature also limited the step coverage performance of the molybdenum film. Smooth, low resistivity molybdenum films with good step coverage are highly beneficial qualities of thin films used in semiconductor device manufacturing.

There is a continuing need to make molybdenum metal films and coatings on a variety of substrates at lower deposition temperatures and without complicated and expensive heating and vapor abatement equipment.

SUMMARY

To overcome the problems of high temperature molybdenum processing, including rough and high resistivity films formed between from 550° C. to 700° C., a boron decomposition layer or boron nucleation layer was deposited on the substrate which was subsequently replaced by a high quality molybdenum nucleation layer on the substrate at temperatures below 550° C. The molybdenum nucleation layer prepared in this way was found to protect the underlying substrate from the etching effect of for example $MoCl_5$, to facilitate nucleation of subsequent smooth CVD Mo growth on top, and to enable CVD Mo deposition at lower temperatures. The molybdenum nucleation layer could also be used to control the grain sizes of the subsequent CVD growth of the bulk molybdenum, and therefore control the electrical resistivity of the final molybdenum film. In some cases, high amounts of boron, visible by SEM, were found underneath the molybdenum layer which increased film resistivity. This was especially problematic where multiple alternate layers of boron and molybdenum were deposited. A solution to the problem of high temperature molybdenum film formation and the presence of high amounts of boron in deposited molybdenum nucleation layers was overcome by consuming or replacing substantially all of the deposited solid boron nucleation layer on the substrate by reaction with a vapor containing molecules of molybdenum and chlorine, for example $MoOCl_4$ or $MoCl_5$. This reaction forms a molybdenum nucleation layer, can take place in the presence or absence of a reducing gas like hydrogen, and concurrently replaces the boron nucleation layer. The resulting molybdenum nucleation layer lowered the cutoff temperature for a subsequent bulk Mo CVD film forming process, using for example a vapor composition comprising $MoOCl_4$ or $MoCl_5$ in the presence of a reducing gas like hydrogen, to between from 400° C. to 575° C. for $MoOCl_4$ and between from 450° C. to 550° C. for $MoCl_5$. Molybdenum CVD films formed in this way had low film resistivity, were smooth, and had better step coverage compared to molybdenum films deposited on substrates by chemical vapor deposited (CVD) molybdenum at high temperatures of about 700° C. using $MoOCl_4$ or $MoCl_5$ as the molybdenum precursor and $H_2$ as a reducing gas.

The disclosure relates to compositions and a method of making a molybdenum nucleation layer on a substrate. Optionally, the substrate may itself be a molybdenum nucleation layer. Alternatively, the substrate may be substantially free of molybdenum.

The method can include the acts or steps of reaction of a pre-existing solid boron comprising nucleation layer on the substrate with a vapor composition comprising molecules containing molybdenum and chlorine atoms. In some versions the vapor composition is substantially free of a reducing gas. The substrate is held at a temperature of between from 450° C. to 550° C. and the reaction with the vapor consumes at least a portion of the boron nucleation layer while forming a molybdenum nucleation layer atop the substrate. In some versions, the molybdenum nucleation layer can be formed on a substrate that is held at a temperature of between from 450° C. to 480° C. In some versions the deposited molybdenum nucleation layer can have a thickness that ranges from about 5 angstroms (5 Å) to about 100 angstroms (100 Å). Suitably, the thickness of the deposited molybdenum nucleation layer may be in the range of from about 5 to about 50 angstroms, optionally in the range of from 5 to about 30 angstroms, for example in the range of from about 5 to about 20 angstroms. The vapor composition comprising molecules of molybdenum and chlorine can be present in the reaction chamber with the heated substrate at a pressure of from between 10 torr to 60 torr, and in some versions at a pressure of from 20 Torr to 40 Torr.

An aspect of the invention provides a method of making a molybdenum layer, the method comprising: reaction of a boron comprising nucleation layer on a substrate with a vapor composition comprising molecules containing molybdenum and chlorine atoms, the substrate being at a temperature of between from 450° C. to 550° C.; said reaction consuming at least a portion of the boron nucleation layer and forming a molybdenum nucleation layer atop the substrate.

The boron comprising nucleation layer that is substantially consumed can have a thickness that is between from about 5 Å to about 100 Å. Suitably, the thickness of the boron comprising nucleation layer may be in the range of from about 5 to about 50 angstroms, optionally in the range of from about 5 to about 30 angstroms, for example in the range of from about 5 to about 20 angstroms.

Advantageously, the boron comprising nucleation layer may be substantially consumed by said reaction, such that the molybdenum layer comprises less than 5 wt % boron, optionally less than 1 wt % boron by elemental analysis.

The boron nucleation layer may suitably be formed by the decomposition of $B_2H_6$ on the heated substrate. In some versions the substrate is heated to 300° C. to 450° C. during the boron nucleation layer deposition. Other boron containing precursors and conditions can be used to deposit the boron nucleation layer. For example, the same or substantially the same temperature that is used for the molybdenum deposition, between from 450° C. to 550° C., could be used for the deposition of the boron nucleation layer.

Thus, in some versions, the method comprises depositing the boron comprising nucleation layer atop the substrate, the substrate being at a temperature of between from 300° C. to 550° C.

The method may optionally comprise depositing a further boron comprising nucleation layer atop said molybdenum nucleation layer atop said substrate, the substrate being at a temperature of between from 300° C. to 550° C.; optionally 300° C. to 450° C., and reaction of the further boron comprising nucleation layer with a vapor composition comprising molecules containing molybdenum and chlorine atoms, the substrate being at a temperature of between from 450° C. to 550° C.; said reaction consuming at least a portion of the further boron nucleation layer and forming a further molybdenum nucleation layer.

The thickness of the further boron comprising nucleation layer may suitably be between from 5 Å to 100 Å. Suitably, the thickness of the further boron comprising nucleation layer may be in the range of from about 5 to about 50 angstroms, optionally in the range of from about 5 to about 30 angstroms, for example in the range of from about 5 to about 20 angstroms. The deposited thickness of the further boron comprising nucleation layer may be less than the deposited thickness of the boron comprising nucleation layer atop the substrate.

The method may comprise vapor depositing the boron comprising nucleation layer atop the substrate for a first period of time and vapor depositing the further boron comprising nucleation layer for a second period of time, the second period of time being shorter than the first period of time.

The further boron comprising nucleation layer may be substantially consumed by said reaction, such that the further molybdenum layer comprises less than 5 wt % boron, optionally less than 1 wt % boron by elemental analysis.

Advantageously, the steps of depositing and reaction may be repeated thereby forming a plurality of further molybdenum nucleation layers.

Optionally, the molybdenum nucleation layer(s) can be formed on a substrate that is held at a temperature of between from 450° C. to 480° C. Advantageously, the vapor composition may be at a pressure of from between 10 torr to 60 torr. The vapor composition may be substantially free of a reducing gas.

It will be appreciated that the method may comprise making a top molybdenum nucleation layer. The molybdenum nucleation layer atop said substrate, or a further molybdenum nucleation layer, may constitute the top molybdenum nucleation layer.

Indeed, another version of the method, for making a top molybdenum nucleation layer, comprises depositing a boron comprising nucleation layer atop a substrate or atop a molybdenum nucleation layer atop the substrate where the substrate or molybdenum nucleation layer atop the substrate is at a temperature of between from 300° C. to 550° C., optionally 300° C. to 450° C., and subsequently reaction of the boron comprising nucleation layer with a vapor composition comprising molecules containing molybdenum and chlorine atoms, the substrate being at a temperature of between from 450° C. to 550° C.

The reaction between the vapor composition and boron layer consumes at least a portion of the boron nucleation layer and forms the top molybdenum nucleation layer. In versions of the method, the thickness of the boron comprising nucleation layer can be between from 5 Å to 100 Å. Suitably, the thickness of the boron comprising nucleation layer may be in the range of from about 5 to about 50 angstroms, optionally in the range of from about 5 to about 30 angstroms, for example in the range of from about 5 to about 20 angstroms.

In some versions of the method of making a top molybdenum layer on a substrate, the consuming at least a portion of the boron nucleation layer substantially or completely consumes the boron nucleation layer. The consuming at least a portion of the boron nucleation layer may generate volatile boron compounds.

In various versions of the method of making a top molybdenum nucleation layer, the steps of depositing a boron comprising nucleation layer (also referred to as a boron decomposition layer), and reacting it with a vapor composition comprising molecules containing molybdenum and chlorine can be repeated one or more times. The one or more molybdenum nucleation layers can be substantially free of boron as determined from SEM analysis, elemental analysis, or an electrical resistivity measurement.

The method of making a molybdenum nucleation layer may comprise vapor depositing a bulk molybdenum layer atop a top molybdenum nucleation layer at a temperature between from 450° C. to 550° C. A molybdenum complex can be used to vapor deposit the bulk molybdenum layer. In some versions the molybdenum complex contains molybdenum and chlorine. In still other versions the molybdenum complex can comprise $MoCl_5$ or it can comprise $MoOCl_4$.

Suitably, the thickness of the film can be 200 angstroms or more and the resistivity of the molybdenum film can be ±20% of the resistivity measured at room temperature (RT, 20° C.-23° C.) of a molybdenum film of substantially similar thickness ±10% deposited from said molybdenum complex on a substrate at 700° C. that is absent the molybdenum nucleation layer.

In versions of the method of making a molybdenum film, the molybdenum film atop the substrate includes the top most bulk molybdenum layer and one or more underlying molybdenum nucleation layers. The molybdenum film can have an electrical resistivity that is less than 25 μΩ·cm for a molybdenum film layer thickness of 200 angstroms or more, in some versions the molybdenum film has electrical resistivity that is less than 20 μΩ·cm for the molybdenum layer thickness of 200 angstroms or more. Lower resistivity molybdenum films consume less power and generate less heat than devices having higher resistivity molybdenum films.

In other versions of the method of making a molybdenum film, the molybdenum film atop the substrate includes the top most bulk molybdenum layer and one or more underlying molybdenum nucleation layers. The molybdenum film atop the substrate can have an electrical resistivity measured at room temperature (RT, 20° C.-23° C.) that is between from 10 μΩ·cm to 25 μΩ·cm, in some versions the electrical resistivity can be between from 12 μΩ·cm to 25 μΩ·cm, and in some other versions the electrical resistivity can be between from 10 μΩ·cm to 20 μΩ·cm, for a molybdenum film having a thickness of from between 800 angstroms to 200 angstroms. In some versions the molybdenum film has a thickness of 200 Å to 1000 Å. In still other versions of the method of making a molybdenum film, the resistivity of the molybdenum film can be within ±20% of the resistivity measured at room temperature (RT, 20° C.-23° C.) of a vapor deposited molybdenum film of similar thickness ±10% deposited at 700° C. on a similar substrate.

One version of a method of making a molybdenum film on a substrate can include the acts or steps of exposing the substrate to $B_2H_6$ gas in the temperature range from 250° C. to 550° C. and pressure range from 10 Torr to 60 Torr; forming a solid boron nucleation layer on the substrate surface; exposing the boron nucleation layer to a vapor comprising molybdenum and chlorine atoms at temperature above 450° C. and converting the boron layer into an molybdenum nucleation layer and generating boron compounds like $BCl_3$ (g) or $BOCl$ (g); optionally repeating the first four steps one or more times to form additional molybdenum nucleation layers; and CVD depositing molybdenum at a temperature of 550° C. or less atop the top molybdenum nucleation layer by $H_2$ reduction of a molybdenum complex comprising molybdenum and chlorine atoms.

Another version of making a molybdenum film on a substrate includes the acts or steps of first exposing the substrate to $B_2H_6$ gas in the temperature range from 300° C. to 550° C. and pressure range from 10 Torr to 60 Torr. A boron decomposition or boron nucleation layer is formed on the substrate surface and the thickness of this layer can be controlled by $B_2H_6$ flow and dose time. The boron layer is subsequently exposed to $MoCl_5$ at temperature above 450° C. The reaction converts the boron layer into a molybdenum nucleation layer with volatile gas comprising $BCl_3(g)$ or $BOCl(g)$ as a by-product. The thickness of the resulting molybdenum nucleation layer depends on the starting thickness of the boron decomposition layer. The process of making a boron nucleation layer and converting it to a molybdenum nucleation layer can be repeated for a number of times until a desired top molybdenum nucleation layer is achieved. Subsequently conventional CVD molybdenum deposition can proceed on the top molybdenum nucleation layer. The molybdenum nucleation layer can help to lower the CVD molybdenum deposition temperature cut-off from 550° C. to 450° C. The CVD molybdenum film deposited on the top nucleation layer has low roughness and good step coverage on deep via structures.

The versions of the method of making a molybdenum film can be carried out in a manufacturing process that forms a semiconductor device on a substrate. The molybdenum films of the disclosure can also be deposited during the manufacture of a variety of electronic, display, or photovoltaic devices. Examples of electronic devices include dynamic random access devices (DRAM) for digital memory storage and 3-D NAND logic gates used in flash memory devices.

DETAILED DESCRIPTION

The disclosure relates to methods of making molybdenum films on substrates utilizing boron and molybdenum nucleation layers. The resulting molybdenum films may have low electrical resistivity, may be substantially free of boron, and can be made at reduced temperatures compared to conventional chemical vapor deposition processes that do not use the boron or molybdenum nucleation layers. The molybdenum nucleation layer formed by this process can protect the substrate from the etching effect of chlorine containing precursors like $MoCl_5$ or $MoOCl_4$, can facilitate nucleation of subsequent CVD Mo growth atop of the molybdenum nucleation layer, and enables molybdenum CVD deposition at lower temperatures. The molybdenum nucleation layer can also be used to control the grain sizes of the subsequent CVD molybdenum growth, and therefore control the electrical resistivity of the final molybdenum film.

The boron nucleation layer can be formed by first exposing the substrate (which may include a thin overlying film), to $B_2H_6$ gas in the temperature range from 300° C. to 550° C. and pressure range of from 10 Torr to 60 Torr. A solid nucleation or decomposition layer comprising boron is formed on the substrate surface (or overlying thin film) and the thickness of this boron comprising nucleation layer or boron comprising decomposition layer can be controlled by $B_2H_6$ flow and dose time. The thickness of this boron comprising nucleation layer can be between from 5 Å to 100 Å. Suitably, the thickness of the boron comprising nucleation layer may be in the range of from about 5 to about 50 angstroms, optionally in the range of from 5 to about 30 angstroms, for example in the range of from about 5 to about 20 angstroms.

The molybdenum nucleation layer can be formed by exposure and reaction of the boron nucleation layer to a vapor composition that includes molybdenum, chlorine, and optionally oxygen at elevated temperatures. This reaction with the vapor composition consumes the boron nucleation layer and replaces it with a molybdenum nucleation layer. The vapor composition can include $MoCl_5$, $MoOCl_4$ or other materials. For example, the substrate with the boron nucleation layer can held at a temperature of between 450° C. and 550° C. on a stage in the reactor and can be exposed to a composition that comprises or consists only of $MoCl_5$, or exposed to a composition that can be a mixture including $MoCl_5$ and an inert gas like argon (Ar), or exposed to a composition that can be a mixture including $MoCl_5$ and a reducing gas like hydrogen ($H_2$). In another example, the substrate on a heated stage with the boron nucleation layer can be held at a temperature of between 450° C. and 550° C. and exposed to a composition that comprises or consists of $MoOCl_4$, or exposed to a composition that can be a mixture including $MoOCl_4$ and an inert gas like argon (Ar), or exposed to a composition that can be a mixture including $MoOCl_4$ and a reducing gas like hydrogen ($H_2$). Exposure of the boron nucleation layer at a temperature of between 450° C. and 550° C. to one or more of these compositions converts the boron nucleation layer into a molybdenum comprising nucleation layer.

$BCl_3$ or other boron containing volatile materials can be generated as a byproduct of the conversion of the boron nucleation layer to the molybdenum nucleation layer. This reaction has temperature cutoff of approximately 450° C.

In the presence of $H_2$, the reaction by-products may include HCl, $BCl_3$ and $OCl_2$ (in the case of vapor composition comprising $MoOCl_4$). The reaction can occur with or without $H_2$ co-reactant on the boron nucleation layer.

The thickness of the resulting molybdenum nucleation layer depends on the starting thickness of the boron nucleation layer. In some versions a vapor composition that includes molybdenum, chlorine, and optionally oxygen, but that does not include a reducing gas, can be used to convert the boron nucleation layer into the molybdenum nucleation layer. The thickness of the resulting molybdenum nucleation layer is proportional to the thickness of boron nucleation layer.

Advantageously, the steps of depositing a boron nucleation layer and reaction of the boron nucleation layer to form a molybdenum nucleation layer may be repeated to form one or more further boron nucleation layers.

Where a plurality of boron nucleation layers are formed, these may be made in substantially identical fashion. Alternatively, differing conditions may be employed for different layers, e.g. as described anywhere herein.

The method may comprise making a top molybdenum nucleation layer. The molybdenum nucleation layer atop said substrate, or a further molybdenum nucleation layer, may constitute the top molybdenum nucleation layer.

Versions of the molybdenum film forming process can further include the act or step of vapor depositing a molybdenum complex on a top molybdenum nucleation layer on the substrate to form a bulk molybdenum layer. The bulk molybdenum layer and one or more underlying molybdenum nucleation layers make up the molybdenum film and the molybdenum film can have a thicknesses that range from 50 Å to 3000 Å; in some versions the thickness of the molybdenum film can be from 200 Å to 1000 Å. The substrate can be at temperatures between from 450° C. to 550° C. during this bulk vapor deposition act or step. In some versions the molybdenum complex can be a vapor composition comprising molybdenum and chlorine atoms, and in other cases the molybdenum complex can be a vapor composition comprising molybdenum, chlorine, and oxygen atoms. Examples of molybdenum complexes that can be used in versions of the method include $MoCl_5$ and $MoOCl_4$.

A composition comprising molecules containing molybdenum and chlorine atoms or a molybdenum complex containing molybdenum and chlorine atoms can be vaporized to make vapor compositions containing molybdenum and chlorine atoms for use in the molybdenum film forming method. The composition or complex can separately comprise $MoCl_5$ (in some versions at a molecular purity of 99% or higher) or $MoOCl_4$ (in some versions at a molecular purity of 99% or higher). In some versions the molybdenum complex can be an organometallic molybdenum compounds containing cyclopentadienyl and other ligands. The molybdenum complex can be purified by sublimation to a molecular purity of greater than 99.99%. For example, $MoCl_5$ can be purified by sublimation to remove trace amounts of higher vapor pressure $MoOCl_4$. Versions of the disclosure can include an ampoule adapted for used in a vapor deposition process, the ampoule contains $MoCl_5$ at a molecular purity of greater than 99.99%. Another version of the disclosure can include an ampoule adapted for used in a vapor deposition process, the ampoule contains $MoOCl_4$ at a molecular purity of greater than 99.99%. Sublimation can be used to purify the $MoCl_5$ or $MoOCl_4$ and remove unwanted metal halides and metal oxyhalides.

Reference to the boron nucleation layer being substantially consumed in versions of the method of making a molybdenum film may refer to no boron being visible by SEM analysis of a cross section of a sample that had one or more boron nucleation layers replaced with one or more molybdenum nucleation layers. Substantially consumed may additionally or alternatively refer to less than 5 wt %, and in some cases less than 1 wt % boron being present in a molybdenum film and in any underlying molybdenum nucleation layers. The boron content can be determined by acid dissolution of the film from a substrate and measured by elemental analysis. Substantially consumed can also refer to a molybdenum film that has a resistivity measured at room temperature (RT, 20° C.-23° C.) that is within ±20% or less of a molybdenum layer of similar thickness (±10%) vapor deposited on a similar substrate at 700° C. from $MoCl_5$.

Thermal budget refers to the cumulative thermal energy imparted to a semiconductor microelectronic transistor, logic gate, or photovoltaic by all thermal processing steps during manufacturing. Controlling the thermal budget of a process can help prevent dopant redistribution injunctions and the diffusion of metals through barrier layers. If high temperatures are required during manufacturing, a moderate thermal budget may be achieved by limiting the duration of the process. Similarly, if a process requires significant time to complete, the temperature can be reduced to avoid an excessive thermal budget. In versions of the method, the molybdenum nucleation layers and bulk molybdenum layers can be deposited at temperatures below 500° C. and with similar deposition times compared to the 700° C. molybdenum process without the Mo nucleation layers. The lower deposition temperature for the new method disclosed herein can be used to decrease the demand on the thermal budget for processes where molybdenum films are used in semiconductor device manufacturing. Additionally, the lower process temperatures achieved by the current process can reduce costs by allowing the utilization of less expensive process equipment and designs.

In versions of the method of making a molybdenum film, the decomposition layer or nucleation layer comprising boron is substantially free of borides. Similarly, the molybdenum nucleation layer and molybdenum film are substantially free of borides. Borides are materials that are formed between boron and a more electronegative element like silicon. Boride layers have been suggested as barrier layers in the manufacture of integrated circuits to inhibit the diffusion of metals and other impurities into regions underlying barrier layers. Borides are typically formed using chemical vapor deposition (CVD) techniques. For example, a metal tetrachloride may be reacted with diborane to form a metal diboride using CVD. However, when Cl-based chemistries are used to form boride barrier layers, reliability problems can occur. In particular, boride layers formed using CVD chlorine-based chemistries typically have a high chlorine content (e.g., chlorine content greater than about 3%). A high chlorine content is undesirable because the chlorine may migrate from the boride barrier layer into adjacent interconnection layers, which can increase the contact resistance of such interconnection layers and potentially change the characteristics of integrated circuits made therefrom. Molybdenum films prepared by the methods disclosed herein have been found to protect the substrate from the etching effect of $MoCl_5$, $MoOCl_4$.

In versions of forming a molybdenum film atop a substrate, the bulk molybdenum, the molybdenum nucleation layer(s), and the boron nucleation layers, can be deposited by vapor deposition. Vapor deposition includes any of chemical vapor deposition (CVD), atomic layer deposition (ALD), high and low pressure versions of these, and versions including assisted versions of these such as but not limited to plasma enhanced CVD, laser assisted, and microwave assisted.

In some versions of the disclosure there is a layer of material overlying the substrate. This layer can be for example, but is not limited to, titanium nitride, molybdenum, or other material that would underlie a bulk molybdenum layer in a semiconductor device. For example, when refractory elemental metals like molybdenum are used in polysilicon-metal gate electrode structures, a thin conductive diffusion barrier can be disposed between the polysilicon and the elemental metal to prevent silicidation of the elemental metal during high-temperature processing. The diffusion barrier is typically comprised of conductive metal nitrides such as tungsten nitride (WN), titanium nitride (TiN), tantalum nitride (TaN) and/or respective silicon-containing ternary compounds such as WSiN, TiSiN, and TaSiN.

In some versions, the substrate comprises a molybdenum nucleation layer, for example a molybdenum nucleation layer previously formed in accordance with the invention.

Substrates that can be used in versions of the method include silicon, silicon oxide, gallium arsenide, alumina, and other ceramics and metals with suitable chemical and temperature properties.

A boron nucleation layer or boron decomposition layer can have a thickness that ranges from about 5 angstroms (5 Å) to about 100 angstroms (100 Å). A molybdenum nucleation layer can have a thickness that ranges from about 5 angstroms (5 Å) to about 100 angstroms (100 Å). The boron nucleation layer can be deposited on the substrate or a layer on top of the substrate that is heated to a temperature that is between 250° C. up to and including 550° C. In some versions the boron nucleation layer can be deposited on the substrate or a layer on top of the substrate that is heated to a temperature that is between 300° C. up to and including 450° C. Boron nucleation layers made between 300° C. up to and including 450° C. provide bulk molybdenum layers that are smooth and that have low resistivity. The one or more $B_2H_6$ nucleation layers can be deposited by exposing the substrate to $B_2H_6$ gas in the temperature range from 300° C. to 550° C. and pressure range from 10 Torr to 60 Torr.

Bulk molybdenum vapor deposition from a molybdenum complex onto the top nucleation layer can occur in the presence of a reducing gas like hydrogen. For example, the molybdenum pentachloride $MoCl_5$ complex can be delivered to the reaction chamber by sublimation from a vessel or ampoule with a flow of $N_2$ or Ar carrier gas. An ampoule vessel containing the molybdenum pentachloride as the complex can for example be heated to a temperature of between 70° C. and 100° C. The temperature for the vaporization will vary depending on the molybdenum complex used. Lower ampoule temperatures are beneficial for all vapor generation because it can decrease the decomposition of the molybdenum complex and thereby provide more consistent molybdenum deposition rates.

EXAMPLE 1

This example illustrates deposition of molybdenum on top of a 50 Å thick titanium nitride layer on a substrate. The thickness of the titanium nitride layer after deposition of the molybdenum nucleation layer and bulk molybdenum was within ±20% of the thickness of the initially measured TiN layer thickness illustrating that the molybdenum nucleation layer provided etch resistance to the underlying TiN from chlorine-containing precursor and byproducts.

The molybdenum film atop the substrate was deposited by a multi-step process at varying temperatures and pressures as detailed in Table 1 below. The first step included sub-steps of: depositing a solid boron nucleation layer on a titanium nitride layer on top of a $SiO_2$ substrate; and exposure of the solid boron nucleation layer (or boron decomposition layer) to a composition that included $MoCl_5$ and hydrogen resulting in substantial replacement of the boron nucleation layer with a molybdenum nucleation layer.

The next step was the deposition of a new boron nucleation layer atop the molybdenum nucleation layer in a shorter soak than the first boron layer nucleation, and then a bulk molybdenum deposition that began by substantially consuming the new boron nucleation to form molybdenum followed seamlessly by bulk deposition of molybdenum to form the molybdenum film on the substrate by reaction of $MoCl_5$ with $H_2$.

The electrical resistivity of the film was measured at room temperature (RT, 20° C. to 23° C.).

TABLE 1

| Sample | Process | B$_2$H$_6$ soak | | MoCl$_5$/H$_2$ | | | Post Measurement | |
|---|---|---|---|---|---|---|---|---|
| | | Stage temp (° C.) | Dep Time (seconds) | Stage temp (° C.) | Pressure Chamber (Torr) | Dep Time (seconds) | Mo film thickness (Å) | Resistivity @RT (four-point µΩ · cm) |
| 9 | Nuc | 300 | 60 | 480 | 10 | 30 | 1.6 | NA |
| | Bulk | 300 | 30 | 480 | 10 | 600 | | |
| 10 | Nuc | 300 | 60 | 480 | 40 | 30 | 683.8 | 12.9 |
| | Bulk | 300 | 30 | 480 | 40 | 600 | | |
| 11 | Nuc | 300 | 60 | 460 | 40 | 30 | 563.2 | 13.7 |
| | Bulk | 300 | 30 | 460 | 40 | 600 | | |
| 12 | Nuc | 300 | 60 | 450 | 40 | 30 | 297.6 | 16.9 |
| | Bulk | 300 | 30 | 450 | 40 | 600 | | |

As detailed in Table 1, the deposition temperature of molybdenum nucleation layer was conducted at temperatures of from 480° C. to 450° C. and specifically at temperatures of 480° C., 460° C., or 450° C. The pressure for the nucleation or bulk molybdenum deposition step was changed between 10 Torr and 40 Torr. The MoCl$_5$ ampoule temperature (Amp temp ° C.) was 90 degrees Celsius.

The results of this example show that at 10 Torr process pressure, little or no Mo deposition was obtained at 480° C. However at 40 Torr process pressure, Mo film deposition rates resulted in films that were about 300 Å or thicker and that the deposition rate decreased as deposition temperature decreased. At 480° C. and 40 Torr pressure the molybdenum deposition rate was about 65 Å/min; at 460° C. and 40 Torr pressure the molybdenum deposition rate was about 54 Å/min; and at 460° C. and at 40 Torr pressure the molybdenum deposition rate was about 28 Å/min.

The results of this example also show that molybdenum films were made comprising the bulk molybdenum layer and one or more molybdenum nucleation layers which had a four point electrical resistivity measured at room temperature (RT, 20° C.-23° C.) that was between from 12 µΩ·cm to 20 µΩ·cm for the molybdenum films having a thickness of from between 700 angstroms to 300 angstroms respectively. All films showed low resistivity of below 20 µΩ·cm when measured at room temperature (RT, 20° C.-23° C.).

EXAMPLE 2

This comparative example illustrates the deposition of molybdenum on a substrate without a molybdenum nucleation layer. Deposition was tested at stage temperatures of from 550° C. to 700° C. and deposition times were varied from 30 seconds to 600 seconds. Deposits of MoCl$_5$ to form Mo were made on a 100 Å TiN layer on top of a SiO$_2$ substrate. The MoCl$_5$ ampoule was heated to 70° C., the chamber pressure was 60 Torr, H$_2$ flow rate was 2000 sccm, and argon carrier gas flow was 50 sccm.

The results in Table 2 show that CVD deposition of Mo film was achieved on TiN coated substrates using MoCl$_5$/H$_2$ at stage temperature above 550° C. At lower temperature (e.g. <550° C. stage temperature) Mo ceased to deposit due to substrate etching effect from MoCl$_5$ and inadequate nucleation.

TABLE 2

| Sample | Stage (substrate) temperature (° C.) | Dep. Time (seconds) | Molybdenum film thickness (Å) | Resistivity (four-point µΩ · cm) @RT |
|---|---|---|---|---|
| 322-237-15 | 700 | 30 | 64.4 | 27.5 |
| 322-237-12 | 700 | 180 | 340.8 | 16.1 |
| 322-237-13 | 700 | 120 | 231.2 | 21.8 |
| 322-399-7 | 600 | 60 | 59.9 | 40.4 |
| 322-399-5 | 600 | 180 | 150.5 | 28.3 |
| 322-399-3 | 600 | 300 | 248.2 | 30.3 |
| 322-399-9 | 550 | 600 | 241.7 | 60.0 |
| 322-399-13 | 550 | 180 | 37.1 | 56.0 |

The results of this example show that at approximately the same deposition time of 180 seconds, the thickness of the deposited molybdenum film decreased from 341 Å at 700° C. (deposition rate of 1.89 Å/sec), to 150 Å at 600° C. (deposition rate of 0.83 Å/sec), and was as low as 37 Å at 550° C. (deposition rate of 0.2 Å/sec). For films of similar thickness prepared at the different temperatures, the molybdenum film resistivity measured at room temperature (RT, 20° C.-23° C.) increased with decreasing deposition temperature. For example the 241 Å thick Mo film deposited at 550° C. had a resistivity of 60 µΩ·cm; the 248 Å thick Mo film that was deposited at 600° C. had a resistivity of 30.3 µΩ·cm, while the 231 Å thick film that was deposited at 700° C. had resistivity of 21.8 µΩ·cm.

EXAMPLE 3

This example illustrates making a molybdenum film comprising one or more molybdenum nucleation layers and a bulk molybdenum layer deposited by vapor deposition from MoCl$_5$.

The resulting molybdenum films were made and characterized as detailed in Table 3. The substrates used had a 50 Å titanium nitride layer atop SiO$_2$. Formation of the solid boron nucleation layer on the TiN layer was performed at a stage temperature of 300° C. chamber pressure of 40 Torr, a B$_2$H$_6$ flow of 35 sccm and an argon flow of 250 sccm; times were varied between 60 and 30 seconds depending on whether a boron nucleation layer was being formed on the TiN or on the initial molybdenum nucleation layer. The estimated thickness of the boron nucleation layer was 5 to 30 angstroms.

MoCl$_5$ ampoule temperature was 90° C., chamber pressure was 20 Torr, argon carrier flow was 100 sccm, H$_2$ was 2000 sccm and stage temperature varied from 480° C. to 500° C. Reaction times were varied between 30 seconds and 600 seconds depending on whether a molybdenum nucleation layer was being formed by consuming the initial boron nucleation layer or whether the second molybdenum nucleation layer was being formed followed by bulk Mo CVD.

TABLE 3

| Sample | Process | $B_2H_6$ soak Substrate Temp (° C.) | Time (sec) | $MoCl_5/H_2$ Substrate Temp (° C.) | Time (sec) | Post Measurement Mo film Thickness (Å) | Resistivity (4-point, $\mu\Omega \cdot cm$)@RT |
|---|---|---|---|---|---|---|---|
| A | Nuc | 300 | 60 | 500 | 30 | 638.9 | 14.3 |
|   | Bulk | 300 | 30 | 500 | 600 |  |  |
| B | Nuc | 300 | 60 | 480 | 30 | 385.5 | 19.1 |
|   | Bulk | 300 | 30 | 480 | 600 |  |  |

These molybdenum films had electrical resistivities measured at room temperature that ranged between from 12 $\mu\Omega \cdot cm$ to 25 $\mu\Omega \cdot cm$ for the molybdenum layer having a thickness of from between 800 angstroms to 200 angstroms respectively.

The results of this example further show that low resistivity molybdenum films can be made at substrate temperatures of between from 480° C. and 500° C. by consuming a boron nucleation layer via the reaction of the boron comprising nucleation layer on the substrate with a vapor composition comprising molecules containing molybdenum and chlorine atoms. The resistivity of the bulk molybdenum film in this example was ±20% of the resistivity as measured at room temperature of a bulk molybdenum layer of substantially similar thickness (±10%) deposited from the same molybdenum complex on a similar substrate at 700° C. that was absent the molybdenum nucleation layer. For example, the deposition of molybdenum on a similar substrate using the molybdenum complex of sample 322-237-12 in Example 2 gave a film with a resistivity of about 16.1 $\mu\Omega \cdot cm$ for a 340 Å thick film.

EXAMPLE 4

This example illustrates the detrimental effect of excessive residual boron on resistivity of molybdenum films deposited with boron nucleation layers and the cutoff temperature for the deposition of molybdenum using boron nucleation layers.

The molybdenum thickness following deposition at substrate temperatures 450° C., 500° C., and 550° C. were measured after 1, 2, 3, 4, 5 cycles. After 5 nucleation cycles, the molybdenum film thickness at the 450° C. deposition temperature was less than 25 Å. After 5 nucleation cycles, the molybdenum film thickness at the 500° C. deposition temperature was about 275 Å. After 5 nucleation cycles, the molybdenum film thickness at the 550° C. deposition temperature was about 410 Å. Based on these results the cutoff temperature for the reaction between $MoCl_5$ and boron was determined to be between 450° C. and 500° C.

The molybdenum film resistivities measured at room temperature following deposition at substrate temperatures 500° C., and 550° C. were measured after 1, 2, 3, 4, 5 cycles. The resistivity after 1 nucleation cycle at 500° C. was too high to measure, while the resistivity of molybdenum film after 1 nucleation cycle at 550° C. was about 310 $\mu\Omega \cdot cm$. The resistivity after 2 nucleation cycles for the molybdenum film formed at 500° C. was about 250 $\mu\Omega \cdot cm$, while the resistivity of molybdenum film after 2 nucleation cycle at 550° C. was about 275 $\mu\Omega \cdot cm$. The resistivity after 5 nucleation cycles for the molybdenum film formed at 500° C. was about 250 $\mu\Omega \cdot cm$, while the resistivity of molybdenum film after 5 nucleation cycle at 550° C. was about 340 $\mu\Omega \cdot cm$. The resistivities after 2 nucleation cycles in this example are much higher than similar films made after 2 nucleation cycles in Example 1 for example, and without wishing to be bound by theory, is believe to be due to the presence of the boron in the films.

EXAMPLE 5

This example illustrates the deposition of molybdenum on a substrate without a boron nucleation layer that had a TiN layer. The substrate was heated to 700° C. on a stage in the reactor and treated with a composition comprising $MoCl_5$ vapor and differing amounts of hydrogen gas. Process conditions included an inert argon gas flow of 50 sccm, a chamber pressure of 60 Torr, and a low hydrogen flow rates of 2000 sccm and a high hydrogen flow rate of 4000 sccm.

The results of this example show that the 4 point measured electrical resistivity of the molybdenum film deposited on the substrate without a nucleation layer ranged from about 15$\mu\Omega \cdot cm$ to 23 $\mu\Omega \cdot cm$ for a 200 Å thick molybdenum film deposited without a boron nucleation layer to about 10 $\mu\Omega \cdot cm$ to 16 $\mu\Omega \cdot cm$ for a 600-800 Å thick molybdenum film deposited without a boron nucleation layer. The resistivity of all films prepared using the higher hydrogen flow rate were lower than those prepared at the lower hydrogen flow rate and for approximately 800 Å thick molybdenum films, the resistivity of the film made at the higher hydrogen flow rate was lower by about 5 $\mu\Omega \cdot cm$ compared to samples made at the lower hydrogen flow rate. The molybdenum film resistivity decreased with increasing film thickness.

While various compositions and methods are described, it is to be understood that this invention is not limited to the particular molecules, compositions, designs, methodologies or protocols described, as these may vary. It is also to be understood that the terminology used in the description is for the purpose of describing the particular versions or embodiments only, and is not intended to limit the scope of the present invention which will be limited only by the appended claims.

It must also be noted that as used herein and in the appended claims, the singular forms "a", "an", and "the" include plural reference unless the context clearly dictates otherwise. Thus, for example, reference to an "nucleation layer" is a reference to one or more nucleation layers and equivalents thereof known to those skilled in the art, and so forth. Unless defined otherwise, all technical and scientific terms used herein have the same meanings as commonly understood by one of ordinary skill in the art. Methods and materials similar or equivalent to those described herein can be used in the practice or testing of embodiments of the present invention. All publications mentioned herein are incorporated by reference in their entirety. Nothing herein is to be construed as an admission that the invention is not entitled to antedate such disclosure by virtue of prior invention. "Optional" or "optionally" means that the subsequently described event or circumstance may or may not occur, and that the description includes instances where the event occurs and instances where it does not. All numeric values herein can be modified by the term "about," whether or not explicitly indicated. The term "about" generally refers to a range of numbers that one of skill in the art would consider equivalent to the recited value (i.e., having the same function or result). In some embodiments the term "about" refers to ±10% of the stated value, in other embodiments the term "about" refers to ±2% of the stated value. While compositions and methods are described in terms of "comprising" various components or steps (interpreted as meaning "including, but not limited to"), the compositions and methods can also "consist essentially of" or "consist of" the various components and steps, such terminology should be interpreted as defining essentially closed or closed member groups.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

The invention claimed is:

1. A method of making a molybdenum layer, the method comprising:
   reaction of a boron comprising nucleation layer on a substrate with a vapor composition comprising molecules containing molybdenum and chlorine atoms, the substrate being at a temperature of between from 450° C. to 550° C.; said reaction consuming at least a portion of the boron nucleation layer and forming a molybdenum nucleation layer atop the substrate.

2. The method of claim 1 wherein the thickness of the boron comprising nucleation layer is between from about 5Å to about 50Å.

3. A method of making a molybdenum layer, the method comprising:
   reaction of a boron comprising nucleation layer on a substrate with a vapor composition comprising molecules containing molybdenum and chlorine atoms, the substrate being at a temperature of between from 450° C. to 550° C.; said reaction consuming at least a portion of the boron nucleation layer and forming a molybdenum nucleation layer atop the substrate, wherein the boron comprising nucleation layer is substantially consumed by said reaction, such that the molybdenum layer comprises less than 5 wt % boron, optionally less than 1 wt % boron, by elemental analysis.

4. The method of claim 3 comprising depositing the boron comprising nucleation layer atop the substrate, the substrate being at a temperature of between from 300° C. to 550° C.

5. The method of claim 3 further comprising:
   depositing a further boron comprising nucleation layer atop said molybdenum nucleation layer atop said substrate, the substrate being at a temperature of between from 300° C. to 550° C.; and
   reaction of the further boron comprising nucleation layer with a vapor composition comprising molecules containing molybdenum and chlorine atoms, the substrate being at a temperature of between from 450° C. to 550° C.; said reaction consuming at least a portion of the further boron nucleation layer and forming a further molybdenum nucleation layer.

6. The method of claim 5 wherein the thickness of the further boron comprising nucleation layer is between from about 5Å to about 50Å.

7. The method of claim 5, wherein the deposited thickness of the further boron comprising nucleation layer is less than the deposited thickness of the boron comprising nucleation layer atop the substrate.

8. The method of claim 5 comprising vapor depositing the boron comprising nucleation layer atop the substrate for a first period of time and vapor depositing the further boron comprising nucleation layer for a second period of time, the second period of time being shorter than the first period of time.

9. The method of claim 5, wherein the further boron comprising nucleation layer is substantially consumed by said reaction, such that the further molybdenum layer comprises less than 5 wt % boron, optionally less than 1 wt % boron by elemental analysis.

10. The method of claim 5 wherein the steps of depositing and reaction are repeated thereby forming a plurality of further molybdenum nucleation layers.

11. The method of claim 3, wherein the temperature of the substrate is between from 450° C. to 480° C. during the reaction of the boron comprising nucleation layer(s).

12. The method of claim 3, wherein the vapor composition is at a pressure of from between 10 torr to 60 torr.

13. The method of claim 3, wherein the vapor composition is substantially free of a reducing gas.

14. The method of claim 3, wherein the molybdenum nucleation layer atop the substrate, or a further molybdenum nucleation layer, constitutes a top molybdenum nucleation layer.

15. The method of claim 14, comprising vapor depositing a molybdenum complex to form a bulk molybdenum layer atop the top molybdenum nucleation layer at a temperature between from 450° C. to 550° C.

16. The method of claim 15, wherein the molybdenum complex comprises $MoCl_5$ or $MoOCl_4$.

17. The method as claim 15, wherein the thickness of the molybdenum film is 200 angstroms or more and the resistivity of the bulk molybdenum layer is ±20% of the resistivity of a bulk molybdenum layer of substantially similar thickness ±20% deposited from said molybdenum complex on a substrate at 700° C. that is absent the molybdenum nucleation layer.

18. The method of claim 15, comprising making a molybdenum film comprising the bulk molybdenum layer and one or more molybdenum nucleation layers, the film having an electrical resistivity measured at room temperature that is less than 20 µΩ·cm for a molybdenum film thickness of 200 angstroms or more.

19. The method of claim 3, wherein the substrate comprises one or more molybdenum nucleation layers.

20. The method of claim 3, wherein the substrate comprises a semiconductor substrate.

* * * * *